United States Patent [19]
Ikeda et al.

[11] Patent Number: 5,994,726
[45] Date of Patent: *Nov. 30, 1999

[54] FIELD EFFECT TRANSISTOR ARRAY INCLUDING REFRACTORY METAL SILICIDE INTERCONNECTION LAYER

[75] Inventors: Nobuyuki Ikeda; Takenobu Iwao; Miho Yokota; Shuichi Kato, all of Tokyo, Japan

[73] Assignee: Mitsubishi Denki Kabushiki Kaisha, Tokyo, Japan

[*] Notice: This patent issued on a continued prosecution application filed under 37 CFR 1.53(d), and is subject to the twenty year patent term provisions of 35 U.S.C. 154(a)(2).

[21] Appl. No.: 08/961,142

[22] Filed: Oct. 30, 1997

[30] Foreign Application Priority Data

May 27, 1997 [JP] Japan .................................... 9-137327

[51] Int. Cl.⁶ ................................................ H01L 27/118
[52] U.S. Cl. ........................................... 257/207; 257/211
[58] Field of Search ...................... 257/202–211

[56] References Cited

U.S. PATENT DOCUMENTS

| | | | |
|---|---|---|---|
| 4,750,026 | 6/1988 | Kuninobu et al. | 257/207 |
| 4,870,300 | 9/1989 | Nakaya et al. | 257/207 |
| 4,923,822 | 5/1990 | Wang et al. | |

FOREIGN PATENT DOCUMENTS

| | | |
|---|---|---|
| 4237165 | of 1992 | Japan . |
| 77141 | of 1995 | Japan . |

*Primary Examiner*—David B. Hardy
*Attorney, Agent, or Firm*—Leydig, Voit & Mayer, Ltd.

[57] ABSTRACT

Connection between a PMOS transistor and an NMOS transistor is made through a refractory metal salicide layer in the source and drain regions of these transistors. The salicide is low in resistance, thereby partially substituting for a first Al wiring in intracell wiring. The resulting empty area provides a wiring area and, hence, the freedom of chip layout is enhanced. Besides, in a microcell which constitutes a logic circuit, such as a gate array, lateral wiring grid dots can be utilized as a wiring area.

4 Claims, 20 Drawing Sheets

FIELD EFFECT TRANSISTOR ARRAY INCLUDING REFRACTORY METAL SILICIDE INTERCONNECTION LAYER

BACKGROUND OF THE INVENTION

1. Field of the Invention

The present invention relates to a semiconductor integrated circuit device such as, for example, a gate array or ECA (Embedded Cell Array). In particular, the invention is concerned with a layout of a macrocell serving as a logic circuit such as AND circuit or flip-flop circuit used in the semiconductor integrated circuit, as well as peripheral circuit.

2. Description of the Prior Art

Recently, for improving the performance of transistor processing techniques, self-aligning type silicides such is as $TiSi_2$ and $CoSi_2$, called salicides, obtained by alloying a silicon surface layer with refractory metals such as titanium (Ti) and cobalt (Co), have been becoming popular. Generally, the resistance of source-drain regions or a well region of a field effect transistor which has been alloyed by the formation of a salicide layer is reduced to about one tenth of that of those produced without using the salicidation technique. A further technical improvement making the most of the features of salicide is now expected.

FIG. 20 is a configuration diagram showing a master chip image of a conventional embedded type gate array. In the drawing, the numerals 121 and 124 each denote a group of PMOS transistors, numerals 122 and 123 each denote a group of NMOS transistors, and numeral 125 denotes a peripheral circuit (I/O interface). Although gate arrays of channel fixed type, composite type and QTAT type are also known, an embedded type gate array will here be described from the standpoint of integration degree and device performance.

FIG. 21 shows a basic cell of a cell region of FIG. 20 for forming a logic circuit with a gate array or ECA. In the drawing, numeral 122 denotes a group of PMOS transistors, numeral 123 denotes a group of NMOS transistors, numerals 124, 125 and 126 denote gate, source-drain, and well regions, respectively, of the PMOS transistors, numerals 127, 128 and 129 denote gate, source-drain, and well regions, respectively, of the NMOS transistors, numerals 10a(1) to 10a(n) denote lateral wiring grids, and numerals 11a(1) to 11a(n) denote longitudinal wiring grids. Layout of a macrocell is made using an arrayed basic cell, and placement and wiring are performed for the macrocell to form a semiconductor integrated circuit having a logical function.

FIG. 4 is a layout diagram showing a three-input AND circuit formed by a conventional gate array or ECA, which is disclosed in JP-A-7/7141 . In the drawing, the numeral 1a denotes a power-supply line (VDD), numeral 1b denotes a ground line (GND), numeral 3 denotes a contact, numeral 1c denotes a first aluminum (Al) line, reference marks A, B and C denote input terminals of the three-input AND circuit, and Y denotes an output terminal thereof.

Usually, in a macrocell layout, as shown in FIG. 4, the gate, source-drain, and well regions are electrically connected using contacts 3 and the first aluminum wiring 1c, thereby affording a logical function. In this case, as many contacts are arranged as possible on the source-drain and well regions of transistors and are electrically connected using the first aluminum wiring to diminish the parasitic resistance of those regions. In some cases, for electrical connection of the macrocell, a second aluminum wiring and vias are used as connecting elements in the longitudinal direction.

By placement and wiring of such logic circuits as AND and flip-flop circuits, after layout in the above manner, there is obtained a semiconductor integrated circuit device. In this case, I/O connecting pins of macrocells are connected in such a manner that the first aluminum wiring is used for lateral wiring and the second aluminum wiring used for longitudinal wiring and the wiring are electrically connected together through vias or contacts.

FIG. 12 is a configuration diagram showing a conventional connection between transistors in a gate array or ECA and power-supply and ground wires, and FIG. 13 is a sectional view taken along line 13—13 in FIG. 12. In the drawings, numerals 84a and 84b denote first aluminum lines, numerals 83 denotes a contact, and numeral 81a and 81b denote a power-supply line and a ground line, respectively, which are usually metallic lines, say, aluminum lines. Generally, in a CMOS gate array, a PMOS transistor and an NMOS transistor are adjacent each other, and on one side of the PMOS transistor is disposed the power-supply line 81a which is constituted by the first aluminum wiring, while on one side of the NMOS transistor is disposed the ground line 81b. The power-supply line 81a is connected to a power supply of the chip at both chip ends, and the ground line 81b is connected to the ground of the chip, also at both chip ends.

For connecting the source region of the PMOS transistor to the power supply, the power-supply line 81a is connected to the source region of the PMOS transistor through the first aluminum line 84a, using plural contacts 83. On the other hand, for connecting the source region of the NMOS transistor to ground, the ground line 81b is connected to the source region of the NMOS transistor through the first aluminum line 84b, using contacts 83.

According to the conventional layout of a semiconductor integrated circuit such as gate array or ECA, for example in the case of the three-input AND circuit shown in FIG. 3 or 4 referred to above, the layout of the lateral wiring grid is wholly made using the first aluminum wiring. In the first Al wiring, therefore, the lateral wiring grid is not employable as a wiring region. Further, since the first Al wiring as the ground wiring is laid up and down of the macrocell, there has so far been a restriction such that a wiring layer such as the second Al wiring, other than the first Al wiring must be used as the longitudinal signal wiring. In the layout of a semiconductor integrated circuit device, both macrocell area and wiring area are required independently, so particularly in a complicated integrated circuit the wiring area becomes large, thus leading to an increase in the area of the semiconductor chip.

On the other hand, in the power-supply wiring and ground wiring, as shown in FIGS. 12 and 13, layout is made using the first Al wiring, but for connection thereof with the well region it is required to use many contacts 83 in order to diminish the resistance thereof. Further, it is likely that the aluminum which constitutes the first Al wiring may be influenced by electromigration and be broken during operation of the device.

SUMMARY OF THE INVENTION

In view of the above-mentioned points it is an object of the present invention to provide a semiconductor integrated circuit device which utilizes salicided source-drain and well regions as part of a wiring layer and which thereby facilitates the layout of a macrocell or a peripheral circuit, as well as a method for the layout.

In order to achieve the above-mentioned object, in the first aspect of the present invention there is provided a semiconductor integrated circuit device including on a silicon substrate surface a first field effect transistor group arranged in one direction and connected to a first power-supply wiring for the supply of a first potential, a second field effect transistor group arranged in parallel with the first field effect transistor group and connected to a second power-supply wiring for the supply of a second potential lower than the first potential, and an electrically conductive wiring for connecting the said transistors with each other. In at least one of the first and second field effect transistor groups, a silicide layer is formed in the source-drain regions of each transistor and is connected to the electrically conductive wiring to form a wiring layer. Above this wiring layer there can be laid a signal line using the electrically conductive wiring.

According to the first aspect, in the first and second field effect transistor groups, a wiring layer using silicide is formed in the source-drain regions of each transistor and contacts are formed on the said wiring layer at arbitrary intervals and connected to the electrically conductive wiring. Therefore, a new electrically conductive wiring can be laid in an empty region between adjacent such contacts, so that in chip layout such unused region can be set as a wiring region. That is, placement and wiring can be done efficiently so that a signal line for example can be passed through the said wiring region. This is effective in reducing the chip area of the semiconductor integrated circuit device.

In the second aspect of the present invention there is provided, in combination with the device in the first aspect, a semiconductor integrated circuit device wherein a plurality of wiring grid dots are included in the source-drain regions of each transistor and are arranged in a direction perpendicular to the arranged direction of the first and second field effect transistors, and when a silicide layer is selected as the wiring layer, at least two of the wiring grid dots are used as contacts.

According to the second aspect, since the device is constructed in such a manner that a plurality of wiring grid dots are arranged in a direction perpendicular to the arranged direction of the first and second field effect transistors and that two of the wiring grid dots are used when a silicide layer is selected as part of the wiring layer, another signal wiring can be laid above the wiring layer area which utilizes the silicide layer. Therefore, if this empty area expanding in the transistor arranged direction as mentioned above is utilized for chip layout of a semiconductor integrated circuit composed of plural macrocells, there can be obtained the same effect as in the previous first aspect.

In the third aspect of the present invention there is provided a semiconductor integrated circuit device including on a silicon substrate surface a first field effect transistor group arranged in one direction and connected to a first power-supply wiring for the supply of a first potential, a second field effect transistor group arranged in parallel with the first field effect transistor group and connected to a second power-supply line for the supply of a second potential lower than the first potential, a first electrically conductive wiring which connects a first transistor selected from the first field effect transistor group and a second transistor selected from the second field effect transistor group with each other, a silicide layer formed in at least a part of source-drain regions of the first and second transistors, and a second electrically conductive wiring connected to the silicide layer.

According to the third aspect, since the first and second electrically conductive wirings are connected together through the silicide layer formed in at least a part of the source-drain regions of the first and second transistors, the freedom of connection is enhanced, the definition of I/O pin of a macrocell becomes easier, and it is possible to shorten the chip layout time and reduce the chip area of the integrated circuit.

In the fourth aspect of the present invention there is provided a semiconductor integrated circuit device including on a silicon substrate surface a first power-supply wiring connected to a first power supply, a first field effect transistor group arranged in one direction, a first electrically conductive wiring which connects the first power-supply wiring and a first transistor selected from the first field effect transistor group with each other, a second power-supply wiring connected to a second power supply for the supply of a potential lower than the potential supplied by the first power supply, a second field effect transistor group arranged in parallel with the first effect transistor group, and a second electrically conductive wiring which connects the second power-supply wiring and a second transistor selected from the second field effect transistor group with each other. In the first and second power-supply wirings in contact with a well region and in at least a part of source-drain regions of the first and second field effect transistor groups there is formed a silicide layer, which silicide layer is connected to the first and/or the second electrically conductive wiring to form a wiring layer.

According to the fourth aspect, the silicide layer formed in the first and second power-supply wirings which are in contact with the well region and also in the source-drain regions of the first and second field effect transistor groups is connected to the first and second electrically conductive wirings. Thus, the connection to be done directly by those electrically conductive wirings can be effected through the silicide layer and hence another signal wiring can be laid in this substitute region. This contributes to the facilitating of layout and the reduction of chip size. Besides, since the silicide layer is in "solid" contact with the silicon surface, a lower resistance will do in comparison with the case where the said contacting is done through metallic contacts, and hence the number of contacts used may be small. Further, the area occupied by metal such as aluminum is reduced and therefore breaking of wire induced by the electromigration phenomenon becomes difficult to occur.

In the fifth aspect of the present invention there is provided a semiconductor integrated circuit device including on a silicon substrate surface a first electrically conductive wiring connected to a power supply, a field effect transistor group arranged in one direction, a first transistor selected from the field effect transistor group and with a silicide layer being formed in at least a part of its source-drain regions, second and third transistors adjacent to the first transistor and connected at their source-drain regions to the first electrically conducting wiring, a second electrically conductive wiring using a part of the silicide layer as a wiring layer, and a third electrically conductive wiring formed above the said wiring layer.

According to the fifth aspect, a silicide layer is formed in the source-drain regions of the first transistor, and the source-drain regions of the second and third transistors adjacent thereto are at the power-supply potential, which can be rendered open electrically in relation to the potential of the silicide layer in the first transistor. Thus, an electric signal passing through the silicide layer portion of the second electrically conductive wiring is not influenced by the second and third transistors. In this structure, another third electroconductive wiring can be laid in an unused space formed above the silicide layer portion, thus contributing to the reduction of chip size.

In the sixth aspect of the present invention there is provided a semiconductor integrated circuit device including on a silicon substrate surface a first power-supply wiring connected to a first power supply, a first field effect transistor group arranged in one direction, a first electrically conductive wiring which connects the first power-supply wiring and a first transistor selected from the first field effect transistor group with each other, a second power-supply wiring connected to a second power supply for the supply of a potential lower than the potential supplied by the first power supply, a second field effect transistor group arranged in parallel with the first field effect transistor group, and a second electrically conductive wiring which connects the second power-supply wiring and a second transistor selected from the second field effect transistor group with each other. A silicide layer is formed in the first and second power-supply wirings which are in contact with the well region and also in the source-drain regions of the first and second field effect transistor groups, the silicide layer being connected to the first and/or the second electrically conductive wiring to form a wiring layer.

According to the sixth aspect, since a suicide layer is formed in the first and second power-supply wirings which are in contact with the well region and also in the source-drain regions of the first and second field effect transistor groups and is connected to the electrically conductive wirings, the power-supply wirings are salicided with the well region, thus permitting omission of such a metallic wiring layer as aluminum wiring layer. Therefore, by using this empty area effectively it becomes possible to enhance the freedom of wiring layout and reduce the chip size.

In the seventh aspect of the present invention there is provided, in combination with the device of any of the first to the six aspect, a semiconductor integrated circuit device wherein the silicide layer is rendered low in resistance by heat treatment after the formation of a refractory metal.

According to the seventh aspect, since the silicide layer is formed by heat treatment after the formation of a refractory metal, the resistance thereof can be varied according to circumstances and thus it is possible to make an effective utilization thereof as a wiring layer.

DETAILED DESCRIPTION OF THE PREFERRED EMBODIMENTS

Embodiments of the present invention will be described in detail hereinafter.

Embodiment 1

Figure 1:
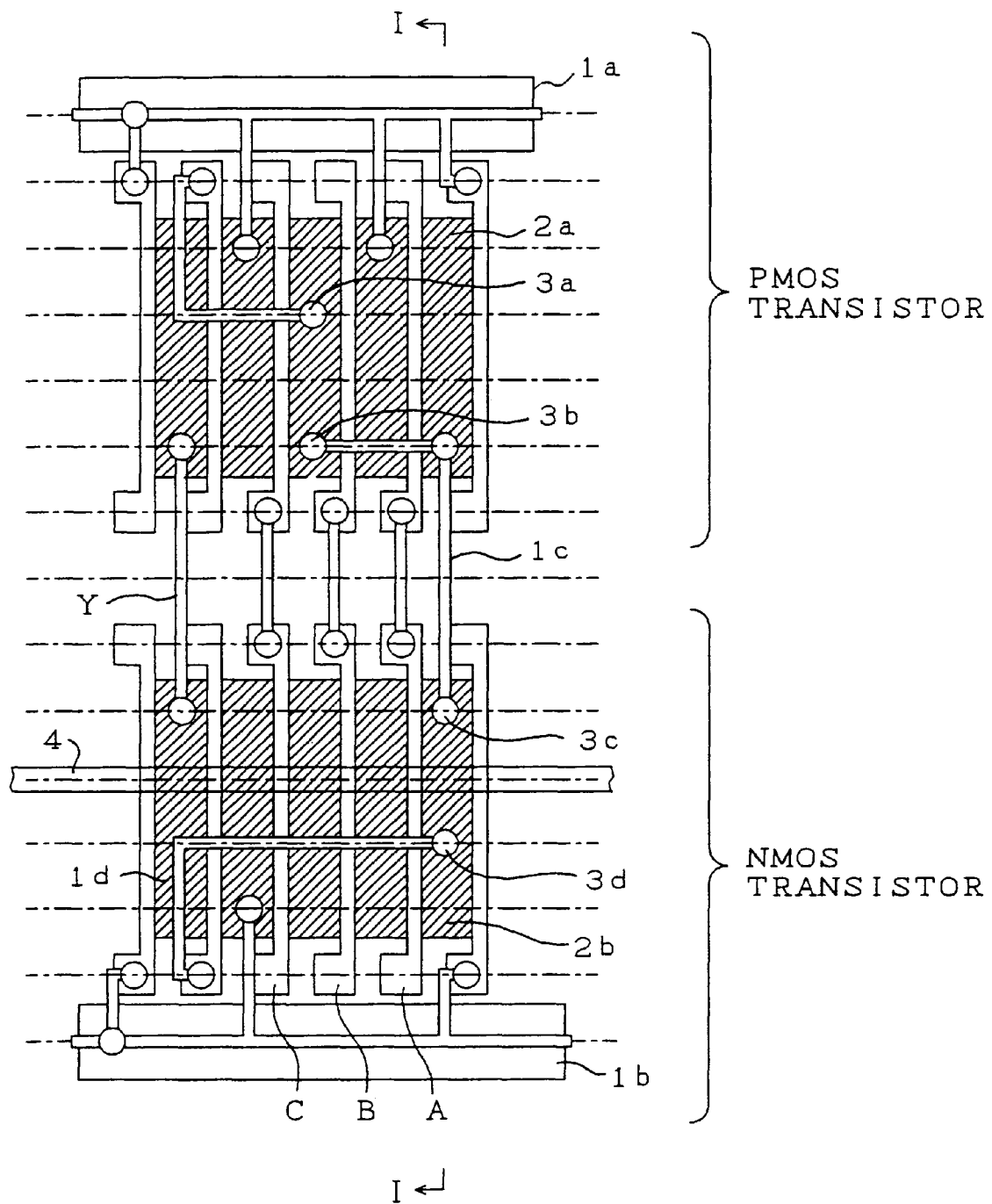
FIG. 1 is a layout diagram for explaining Embodiment 1 of the present invention.
Figure 2:
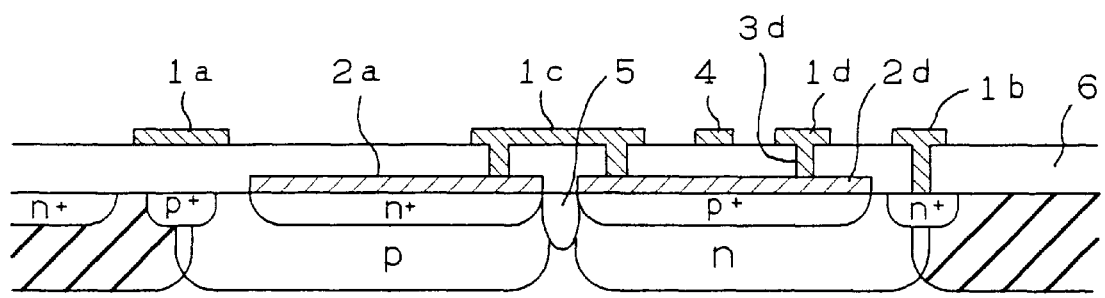
FIG. 2 is a sectional view taken along line 2—2 in FIG. 1.
Figure 3:
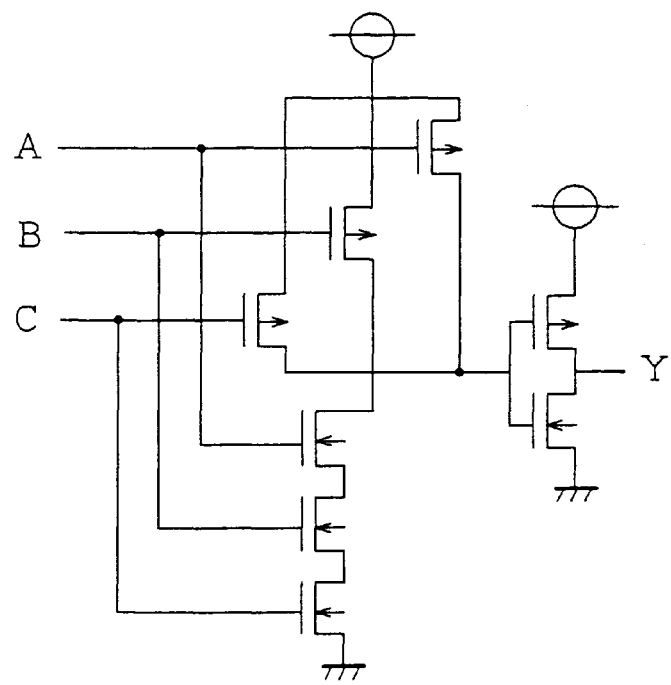
FIG. 3 is a circuit diagram of the layout shown in FIG. 1.
Figure 4:
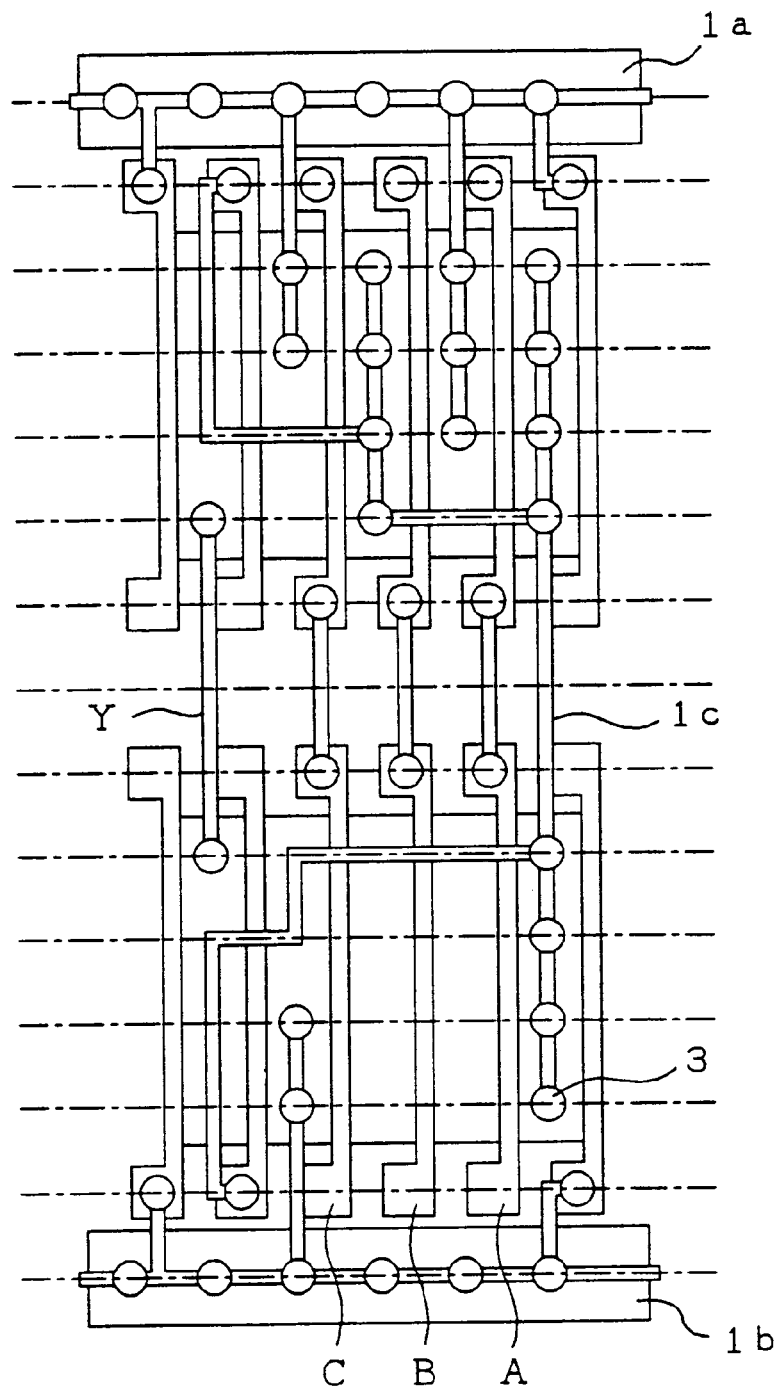
FIG. 4 is a layout diagram according to the prior art.

FIG. 1 is a layout diagram of a three-input AND circuit using a basic cell of a salicided transistor structure, FIG. 2 is a sectional view taken along line 2—2. in the circuit layout of FIG. 1, FIG. 3 is a circuit diagram thereof, and FIG. 4 is a layout diagram according to the prior art. In the drawings, numerals 1a and 1b denote a power-supply line and a ground line, respectively, which are first Al lines, numeral 2a and 2b denote salicided source-drain regions, numerals 3a to 3d denote contacts, numeral 4 denotes another signal line using the first Al wiring, numeral 5 denotes a field oxide film, numeral 6 denotes an interlayer insulating film, reference marks A, B and C denote input terminal gates, and Y denotes an output terminal. In each of the source-drain regions are included a plurality of wiring grid dots. In FIG. 1, four such wiring grid dots are arranged in the longitudinal direction (see FIG. 8).

The "salicide" as referred to herein indicates a refractory metal silicide formed self-aligningly, which has been made low in resistance by heat treatment, for example. To be more specific, the salicide can be obtained by forming a layer of a refractory metal such as cobalt, titanium, molybdenum, or tungsten, on an activation area of a silicon substrate, reacting the refractory metal and silicon by heat treatment for example, to afford an alloy such as a silicide reduced in resistance, and subsequently removing the unreacted portion of the metal and unnecessary portion by photolithography or any other suitable means.

In a gate array or ECA, logical functions which are called cells and are relatively simple and small in scale, such as NAND, NOR and F/F, standardized and filed in library, are combined to design a chip. Particularly, an all over-spread type gate array carries megacells thereon. In FIG. 1, PMOS transistors and NMOS transistors are adjacent each other in the lateral direction. Adjacent drains are separated from each other through a spacing corresponding to the gate width so that they are not mutually affected.

Now, a description will be given of the operation.

Since the source-drain regions 2a and 2b which have been rendered low in resistance up, to about one tenth of the ordinary resistance, by salicidation using a refractory metal can substitute the first Al wiring, the source-drain regions between the contacts 3a and 3b and also between 3c and 3d can be electrically connected or conducted through the salicide layer passing below the interlayer insulating film 6. According to this construction, a space for one wiring grid dot is formed between the contacts 3a and 3b and also between 3c and 3d, so another signal line using the first Al wiring can be passed through the space. At the time of chip layout, therefore, if this empty wiring grid dot is utilized, it is possible to form a wiring line to be used as a wiring region in the lateral direction.

According to Embodiment 1, as described above, salicided source-drain layers can be utilized as part of the first Al wiring and therefore it is possible to include another wiring line, such as a signal line, within the basic cell. This is effective in facilitating the chip layout of the semiconductor integrated circuit.

Embodiment 2

Figure 5:
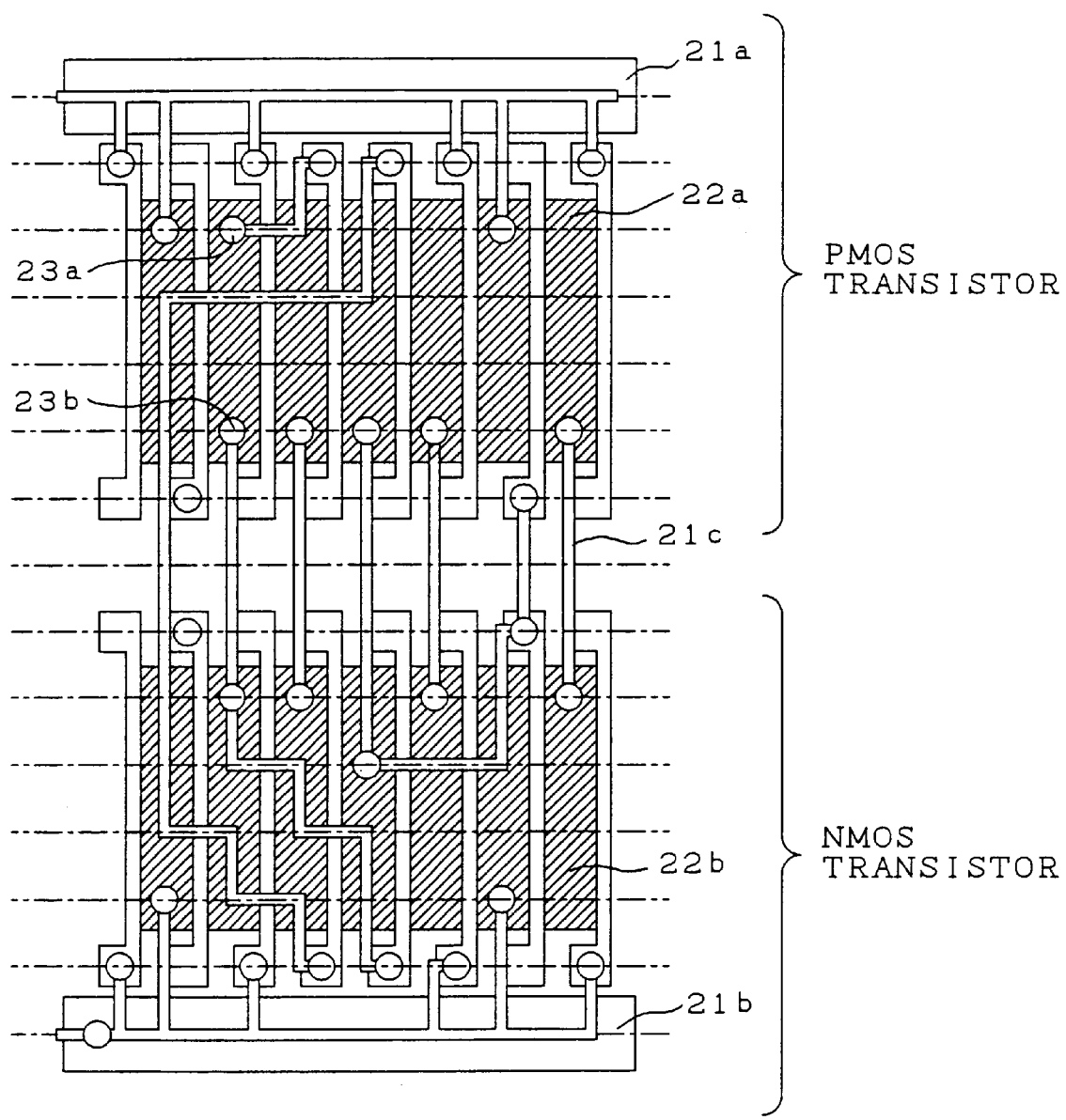
FIG. 5 is a layout diagram for explaining Embodiment 2 of the present invention.
Figure 6:
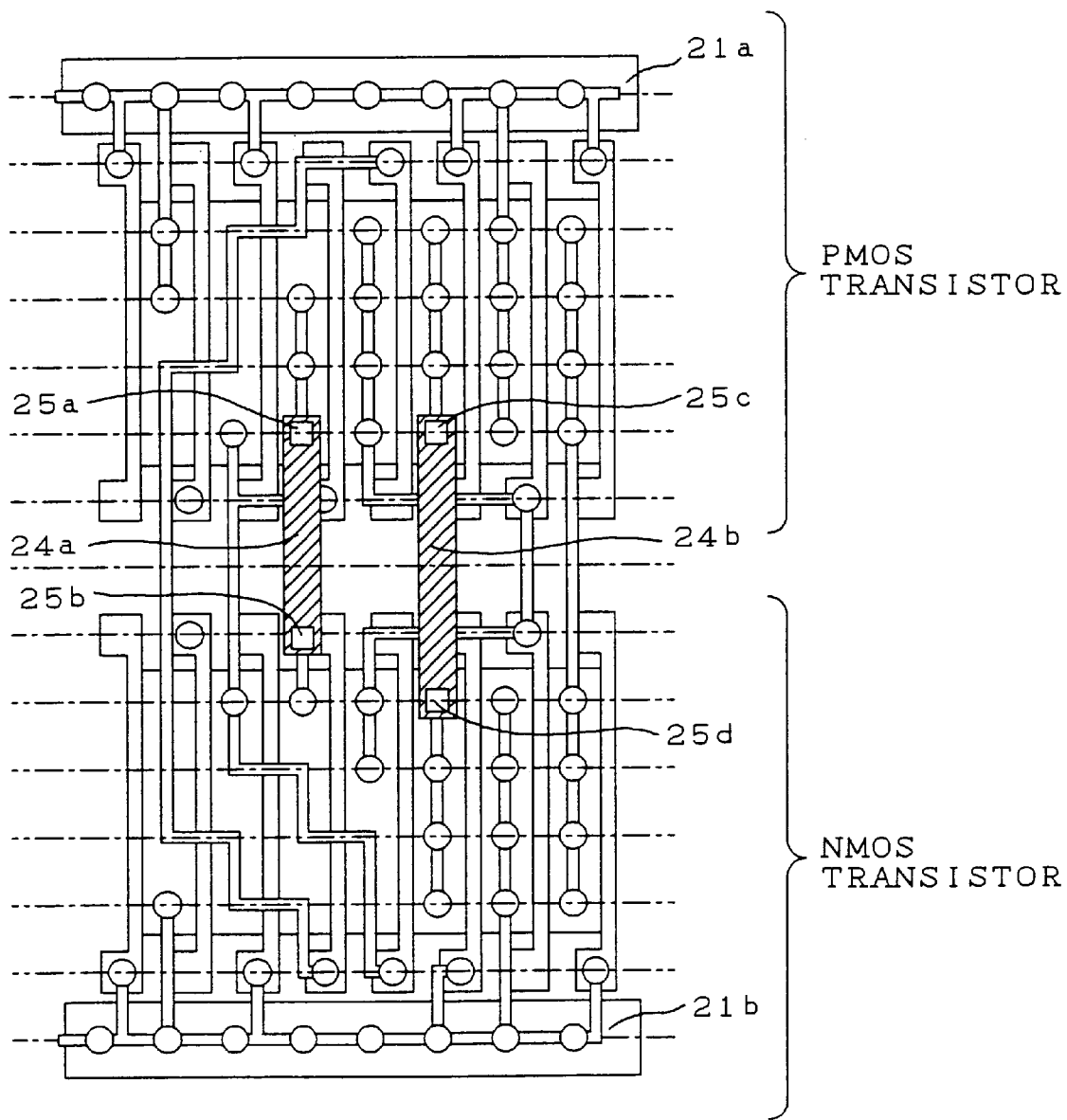
FIG. 6 is a layout diagram according to the prior art.
Figure 7:
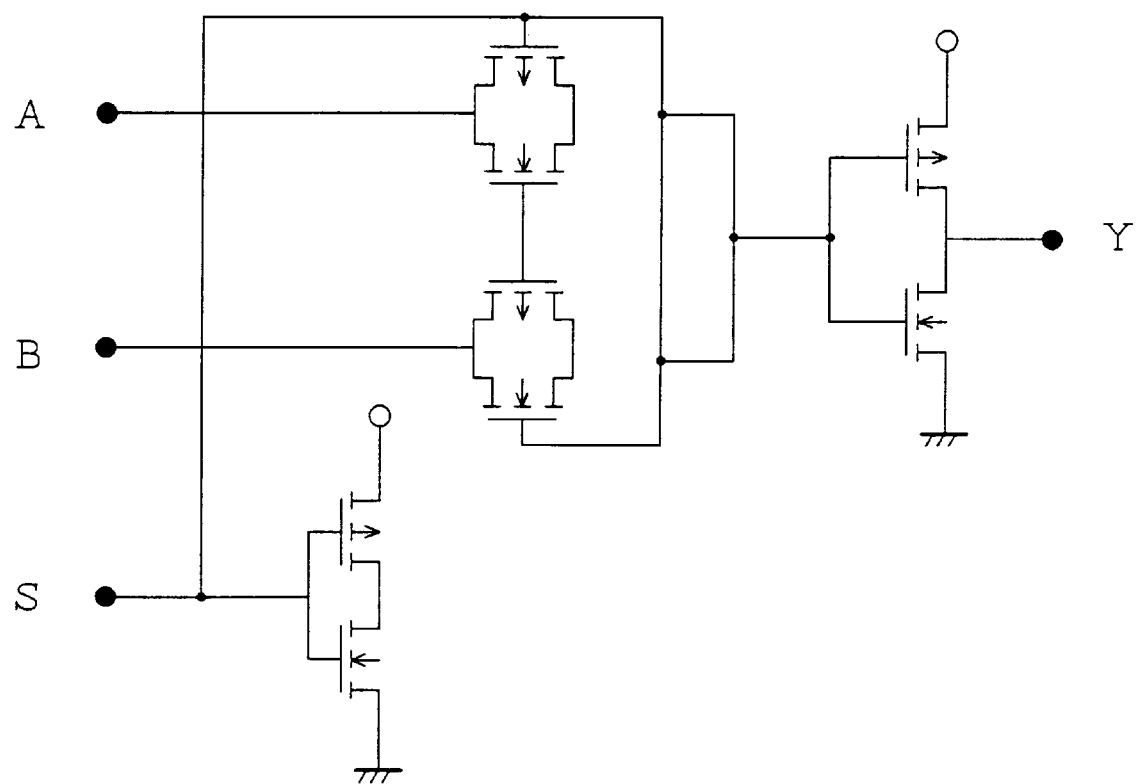
FIG. 7 is a circuit diagram of the layout shown in FIG. 5.

FIG. 5 is a layout diagram of a selector circuit according to Embodiment 2, FIG. 7 is a circuit diagram of the selector circuit, and FIG. 6 is a layout diagram according to the prior art. In the drawings, the numerals 21a to 21c denote first Al lines serving as power-supply and ground lines, numerals 22a and 22b denote salicided source-drain regions, numeral 24 denotes a second Al line, and numerals 25a to 25d denote vias as electrically conductive connecting elements. The wiring layout shown in FIG. 5 is the same as described in Embodiment 1. An electrical connection between contacts 23a and 23b utilizes as a wiring layer a part of the drain region 22a which has been alloyed by salicide formation.

The operation of the circuit will be described below.

For example, between the contacts 23a and 23b in FIG. 5, a part of the source-drain regions which have been rendered low in resistance by salicidation is applied to the first Al wiring, thus permitting another wiring line to pass through the resulting empty space. Besides, in using the salicide layer as a wiring layer, the number of contacts required may be a minimum of two.

In the prior art, for connection to the source-drain regions, a high resistance must be lowered by using many contacts, and the resulting expansion of the area occupied by the first Al wiring is unavoidable. Besides, as can be seen from the layout of FIG. 6, it is required in many cases to use the vias 25a to 25d which connect the first Al wiring with the second Al wiring and also use second Al lines 24a and 24b. According to the layout of this Embodiment 2 there is used a salicide layer, whereby the number of contacts used is kept to a minimum and it is possible to omit the second Al wiring. Further, it is possible to ensure longitudinal wiring grid dots which permit wiring on a macrocell in terms of a signal line at the time of chip layout and hence possible to diminish the chip area of the semiconductor integrated circuit.

According to this Embodiment 2, as described above, the layout of a macrocell is made using a basic cell of a salicided transistor structure, and particularly by utilizing the drain region of a transistor as a wiring layer. It is possible to form wiring grid dots which permit a signal line to be laid in a macrocell. Besides, the wiring grid dots can be utilized as wiring areas in the chip layout of a semiconductor integrated circuit composed of plural macrocells. Thus, there also is attained the effect that the chip area of the semiconductor integrated circuit can be diminished. Of course, the construction of this embodiment is effective in facilitating the layout of a macrocell.

Embodiment 3

Figure 8:
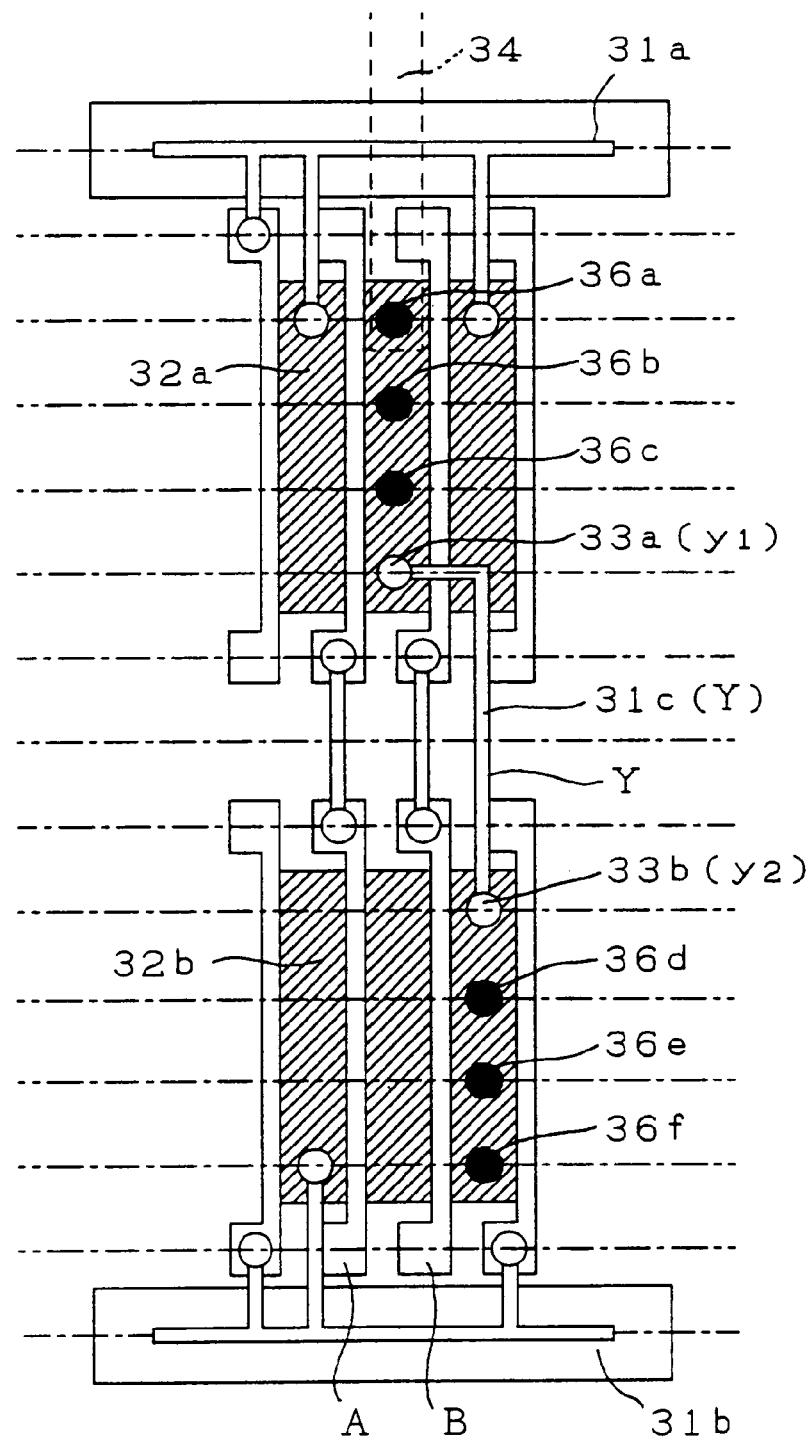
FIG. 8 is a layout diagram for explaining Embodiment 3 of the present invention.
Figure 9:
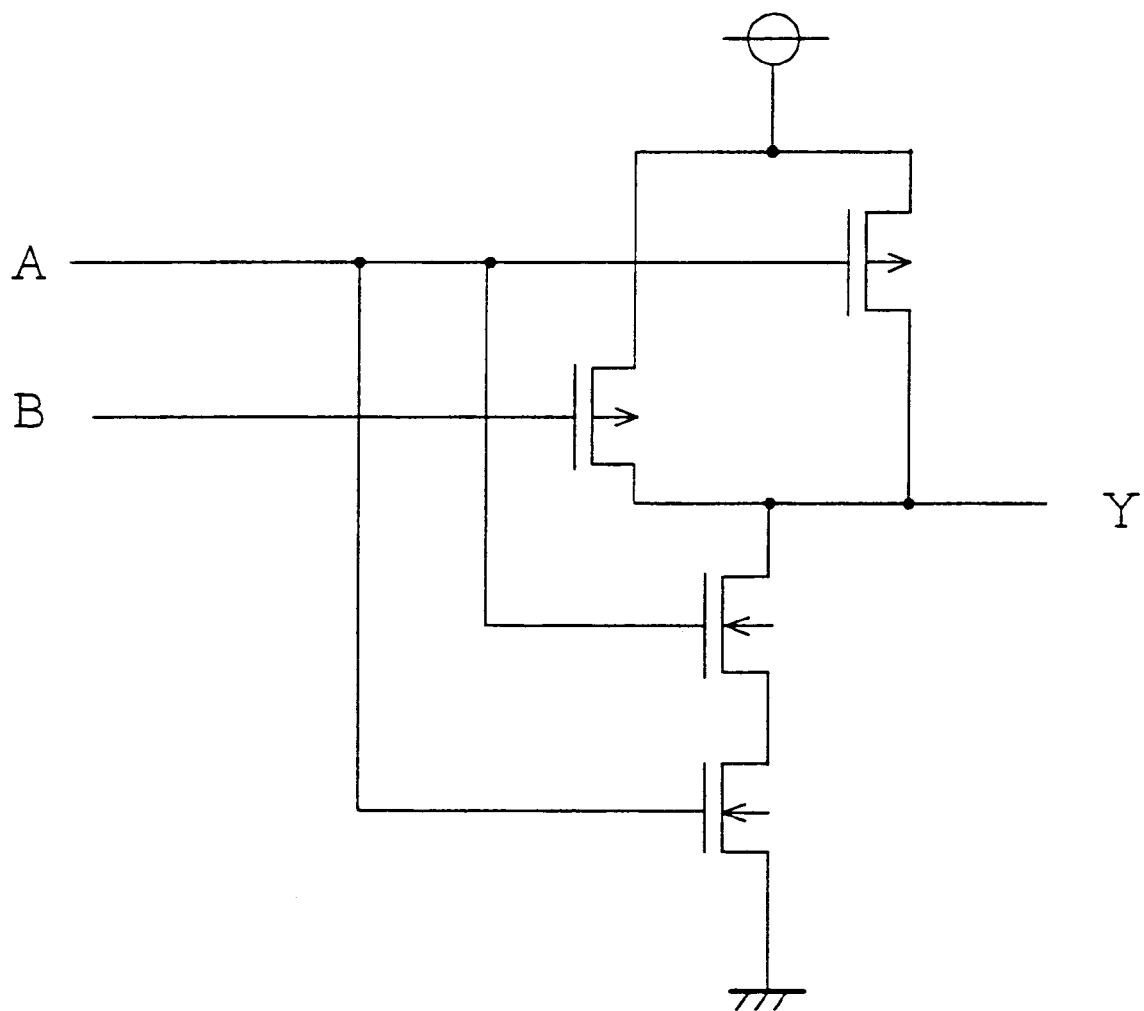
FIG. 9 is a circuit diagram of the layout shown in FIG. 8.

FIG. 8 is a layout diagram of a two-input NAND circuit according to Embodiment 3, and FIG. 9 is a circuit diagram thereof. In the drawings, the numerals 31a to 31c denote first Al lines, numerals 32a and 32b denote salicided drain regions, numerals 33a(y1) and 33b(y2) denote contacts, numeral 34 denotes a second Al line, numerals 36a to 36f denote wiring grid dots contained in salicided drains, reference marks A and B denote input terminals, and mark Y denotes an output terminal.

The following description is now provided about the operation of this circuit.

According to this Embodiment 3, in a layout relating to the definition of pin of the output terminal Y in the two-input NAND circuit, in order to utilize the drain regions which have been rendered low in resistance by salicidation as wiring layers, first the first Al line as the output terminal Y is connected to the salicided drain regions 32a and 32b via the contacts 33a(y1) and 33b(y2) and then the pin of the second Al line used for wiring between macrocells is defined to any one of the contacts 36a to 36f. If the definition of I/O pin of a macrocell having such a logic circuit as a two-input NAND circuit is made in this way, the area for signal line connection of the I/O pin increases. Besides, the freedom of layout is enhanced, for example, by passing another signal line through an empty area. That is, signal wiring between macrocells becomes easier, which contributes to the shortening of chip layout time and the reduction of chip area.

Reference will now be made to FIG. 8 as an example. If the wiring grid dot 36a is defined as a pin in the second Al wiring and the contacts 33a(y1) and 33b (y2) are set at the output terminal Y, it is not necessary that the first or the second Al wiring for the said output terminal pass through the wiring grid dots 36b, 36c and 36d to 36f, thus permitting use in the layout of another signal wiring. On the other hand, according to the definition of pin in the prior art, it is necessary that the second Al wiring be connected to either the contact 33a(y1) or 33b(y2). Therefore, for example in FIG. 8, either the wiring grid dots 36a to 36c or 36d to 36f are influenced at least by the layout of the first or the second Al wiring for the output terminal Y and are restricted in their freedom.

According to this Embodiment 3, as described above, by giving the definition of macrocell pin also to the salicided drain region, it becomes easier to make signal line connection between macrocells, thus giving rise to the effect that the chip layout time can be shortened and the chip area of the integrated circuit can be diminished.

Embodiment 4

Figure 10:
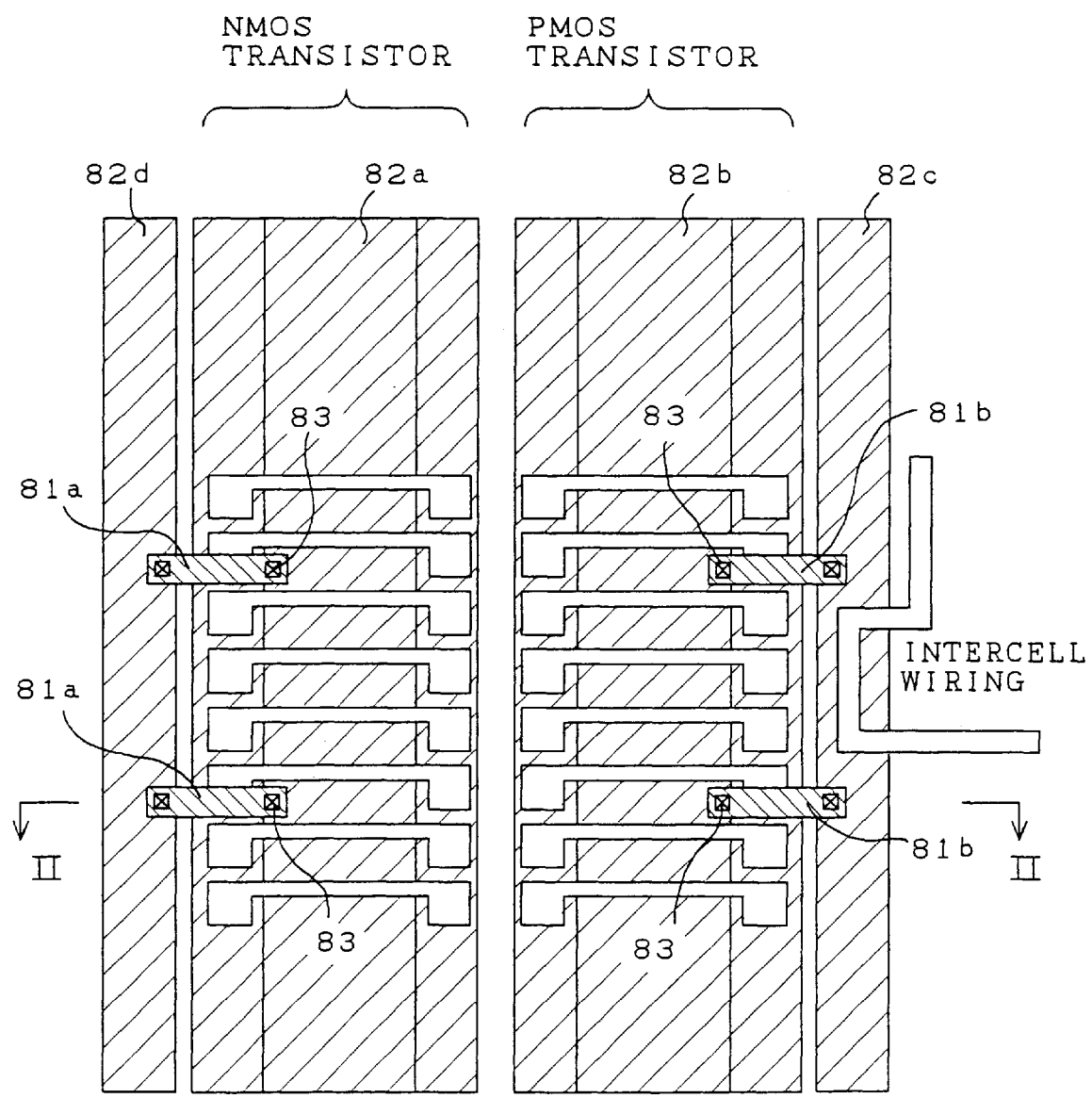
FIG. 10 is a layout diagram for explaining Embodiment 4 of the present invention.
Figure 11:
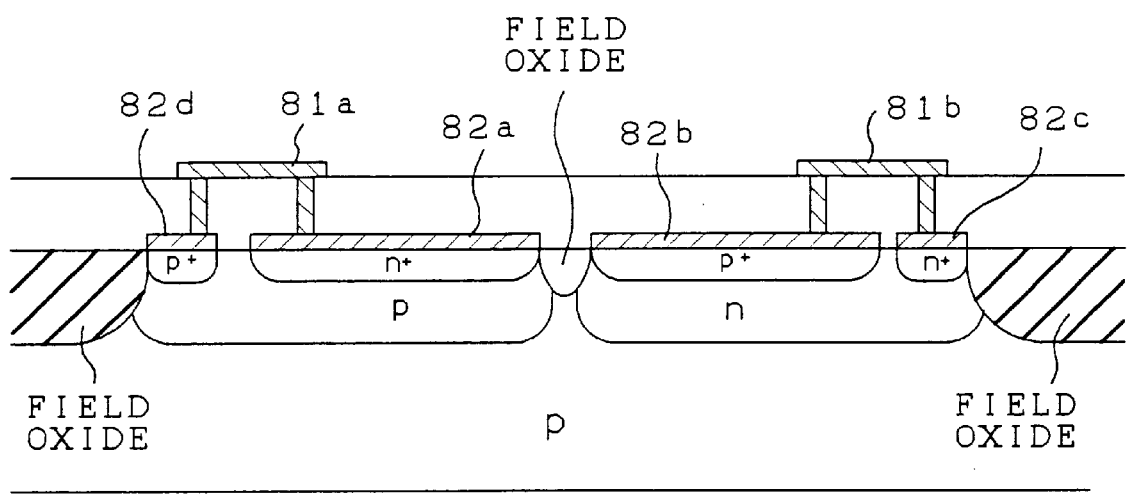
FIG. 11 is a sectional diagram taken along line 11—11 in FIG. 10.
Figure 12:
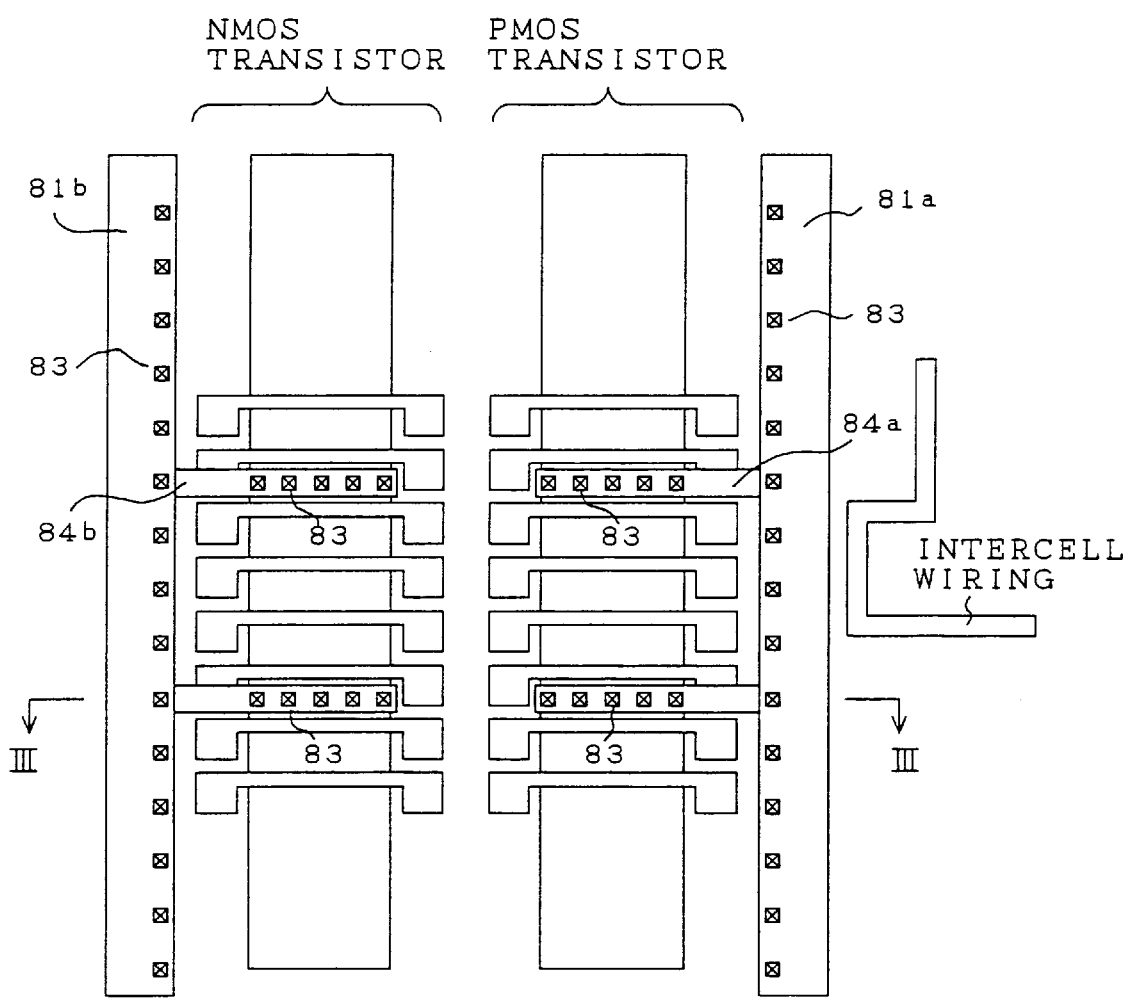
FIG. 12 is a layout diagram according to the prior art.
Figure 13:
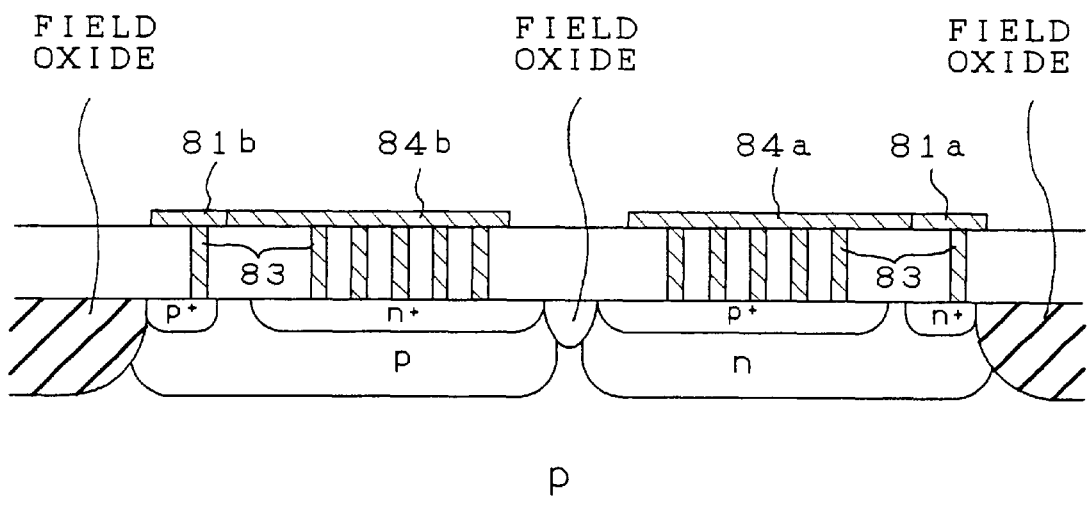
FIG. 13 is a sectional view taken along line 13—13 in FIG. 12.

FIG. 10 is a layout diagram showing a transistor wiring configuration in a gate array or ECA, FIG. 11 is a sectional view taken along line 11—11 in FIG. 10, FIG. 12 is a layout diagram showing a transistor wiring configuration in a gate array or ECA according to the prior art, and FIG. 13 is a sectional view taken along line 13—13 in FIG. 12. In the drawings, numeral 81a denotes a power-supply line and numeral 81b denotes a ground line, which are formed of a metal such as aluminum for example, numerals 82a and 82b denote salicided source regions, numeral 82c denotes a power-supply line formed by salicidation of the well region, numeral 82d denotes a ground line formed by salicidation of the well region, numeral 83 denotes a contact, and numerals 84a and 84b denote first Al lines.

In the conventional gate array, as shown in FIG. 12, PMOS transistors and NMOS transistors are usually adjacent to each other, and on one side of the PMOS transistor is located the power-supply line 81a constituted by the first Al wiring, while on one side of the NMOS transistor is located the ground line 81b. The power-supply line 81a is connected to the power supply of the chip at both chip ends. Likewise, the ground line 81b is connected to the ground of the chip at both chip ends. In connecting the source region of the PMOS transistor to the power supply, connection is made using contacts 83 from the power-supply line 81a to the source region of the PMOS transistor through the first Al line 84b. On the other hand, in connecting the source region of the NMOS transistor to ground, connection is made using contacts 83 from the ground line 81b to the source region of the NMOS transistor through the first Al line 84a.

In this Embodiment 4, as shown in FIGS. 10 and 11, the silicon surfaces of n+ well region 82c connected to the power supply, p+ well region 82d connected to ground, the source region 82a of NMOS transistor and the source region 82b of PMOS transistor are alloyed by salicidation. Further, without the use of such power-supply line and ground line using the first Al wiring as in FIG. 12 which shows a conventional example, alloyed portions 82c and 82d formed by saliciding the well regions are used as power-supply and ground lines, respectively. In this case, the contacts 83 connecting the power-supply line 81a and the n+ well region in FIG. 12 and the contacts 83 connecting the ground line 81b and the p+ well region are not necessary. This is because the salicided power-supply line 82c and ground line 82d corresponding to the power-supply line 81a and ground line 81b in FIG. 12 are in direct contact with the well regions.

In supplying the power-supply potential VDD to the source region of the PMOS transistor in FIGS. 10 and 11, the power-supply line 82c formed by the salicidation of well region is connected to the source region of the PMOS transistor through the first Al line 81b. On the other hand, in supplying the ground potential GND to the source region of the NMOS transistor, the ground wire 82d formed by the salicidation of the well region is connected to the source region of the NMOS transistor through the contact 83 and the first Al line 81a.

The operation of this embodiment will be described below.

According to the wiring structure of Embodiment 4, since salicided power-supply and ground lines are used, that is, since it is not necessary that power-supply line and ground line be drawn using the first Al wiring, this area can be used as an area for drawing connection wiring between cells using the first Al wiring and the second Al wiring. Thus, the intercell connecting wiring area which has, so far, allowed only the use of the second Al wiring, is used as a wiring area, using both first and second Al lines, whereby the chip size can be reduced.

Moreover, in the case where the power-supply and ground lines are drawn using the first Al wiring as in the prior art, a large number of contacts must be arranged spaced from one another between the well region and the first Al wiring as in FIG. 12. This is because a small number of contacts 83 would result in an increase of resistance between the well region and the first Al wiring. However, when the well region is salicided, it is not necessary to use contacts for connection because the surface of the well region is directly alloyed and connected. Consequently, it is possible to omit the process of forming the power-supply and ground lines using the first Al wiring and the process of forming contacts on both lines.

Further, in the case where the power-supply and ground lines are drawn using the first Al wiring, it is possible that the aluminum line will be broken during operation due to of electromigration. However, if the salicided power-supply line and ground lines are used, such a possibility of breakage can be diminished and the reliability is improved.

Thus, according to Embodiment 4, since the intercell wiring area which has so far permitted the use of only the second Al wiring can be used as a wiring for with both first and second Al lines arranged therein, the integration degree is improved and the chip size can be made smaller. Besides, where the well region is alloyed by salicidation, this direct connection can eliminate the necessity of using contacts for connection. Therefore, the process of forming power-supply and ground lines using the first Al wiring and the process of forming contacts on the power-supply and ground lines can be omitted. Additionally, the use of the salicided power-supply line and ground line is effective in reducing the possibility of aluminum breakage caused by electromigration and improving reliability.

Embodiment 5

Figure 14:
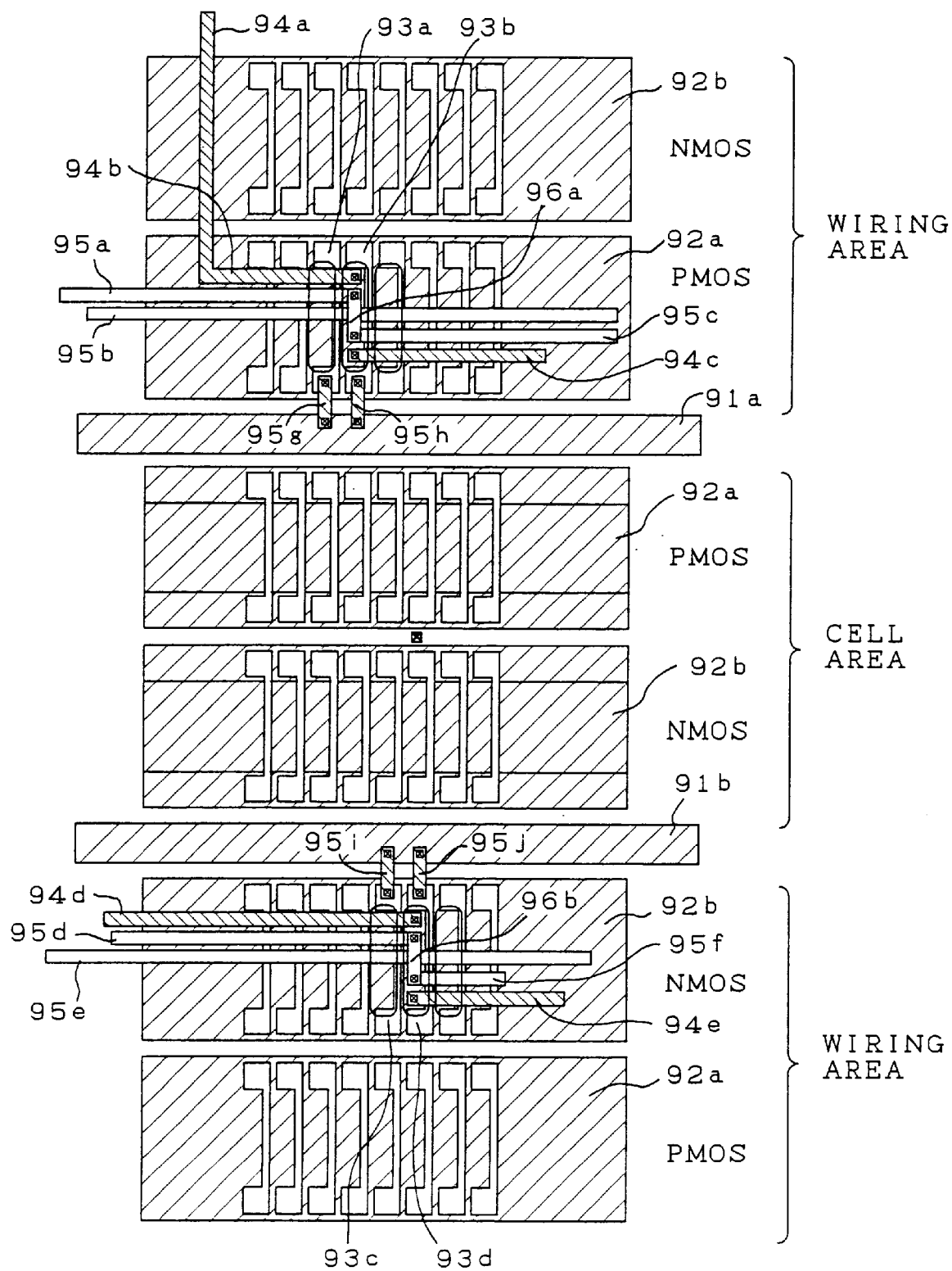
FIG. 14 is a layout diagram for explaining Embodiment 5 of the present invention.

FIG. 14 is a layout diagram showing Embodiment 5. In the drawing, numeral 91a denotes a power-supply line formed by saliciding the well region of PMOS transistor, numeral 91b denotes a ground line formed by saliciding the well region of NMOS transistor, numeral 92a denotes a region formed by saliciding the source region of PMOS transistor, numeral 92b denotes a region formed by saliciding the source region of NMOS transistor, numerals 93a and 93b denote gates of the PMOS transistor, numerals 94a to 94e and 95a to 95j denote signal lines, the signal lines 95g and 95h being connected to a power supply and the signal lines 95i and 95j connected to ground.

Generally, in an SOG (sea of gate) in a gate array, transistors are spread all over the chip surface in advance to produce a master chip, and, at the time of layout, there are defined cell areas and wiring areas for use. In this case, the transistors in the wiring area are not used; the wiring area is used as only the wiring area using first and second Al lines.

By saliciding the source-drain regions of all the transistors in a chip at the time of forming the master chip, not only the cell area but also the source-drain regions of the transistors located in the wiring area and not in use are salicided.

For connecting the intercell wirings 94b and 94c with each other using the salicided source-drain regions in the portion of region "a", the gates 93a and 93b of PMOS transistors in the wiring area are connected to the power-supply line 91a through the line 95g. Further, the signal line 94b is connected, using contacts, to the source (drain) region (region "a") of the transistor having the gate 93b. Since the source (drain) region (region "a") of the transistor is has been alloyed by salicidation, the intercell wirings 94b and 94c can be connected in the region "a".

For connecting the intercell wirings 94d and 94e with each other using the salicided source-drain regions in the portion of region "b", gates 93c and 93d of NMOS transistors in the wiring region are connected to the ground line 91b through the signal lines 95i and 95j. Further, the signal line 94d is connected, using contacts, to the source (drain) region (region "b") of the transistor having the gate 93c. Likewise, the signal line 94e is connected, using contacts, to the source (drain) region (region "b") of the transistor having the gate 93d. Since the source (drain) region (region "b") of the transistor has been alloyed by salicidation, the intercell wirings 94d and 94e can be connected in the region "b".

The operation of this embodiment will be described below.

As shown in FIG. 14, the transistors in the gate array are formed successively in the order of PMOS, NMOS, NMOS and PMOS transistors. Near the PMOS transistor, in the cell area, the power-supply line 91a and, is surely located near the NMOS transistor, the ground line 91b is surely located. That is, PMOS, transistors are located on both sides of the power-supply line, and NMOS, transistors are located on both sides of the ground line.

First, the portion of region "a" will be described. The transistor in region "a" is located in the wiring area and is usually not employed. When the gates 93a and 93b of PMOS transistor are connected to the power-supply line 91a using lines 95g and 95h, the gates 93a and 93b take a potential of "L", so that the regions "c" and "a" become open electrically. Likewise, the regions "a" and "d" become open electrically. Thus, an electrical signal in region "a" does not influence any other region.

When the transistor structure of this Embodiment 5 is used, since the transistor source-drain regions have been alloyed by salicidation, region "a" is employable as the third wiring layer. But in the example of FIG. 14, since there are another signal line 96a of the same layer and the first Al line 95b, the lines 94a and 94c cannot be connected according to the prior art. However, the transistor structure described above permits electrical connection of the lines 94a and 94c in region "a".

Next, region "b" will be described. The transistor in region "b" is located in the wiring area and is usually not employed. When the gates 93c and 93d of NMOS transistor are connected to the ground line 91b using signal lines 95i and 95j, the gates 93c and 93d take a potential of "H", so that the regions "e" and "b" become open electrically. Likewise, the regions "b" and "f" become open electrically. Therefore, no influence of by an electric signal in region "b" is exerted on any other region.

In the case of using the transistor structure of this Embodiment 5, since the transistor source-drain regions have been alloyed by salicidation, region "b" is employable as the third wiring layer. For connecting the lines 94d and 94e in region "b", the second Al wiring is used. But in the example of FIG. 14, since there are another line 96b of the same layer and the signal line 95e of the first Al wiring, the lines 94d and 94e cannot be connected according to the prior art. However, the transistor structure described above permits electrical connection of the lines 94d and 94e in region "b".

Thus, according to Embodiment 5, even in the presence of the signal line 96a (96b) using the second Al wiring, the lines 94b (94d) and 94c (94e) can be connected together in region "a" (region "b"). Heretofore, it has been required to make wiring use another region, thus resulting in increase of the chip size. However, by using as a wiring layer the salicided source (drain) region of transistor so far not used, it becomes possible to reduce the chip size.

Embodiment 6

Figure 15:
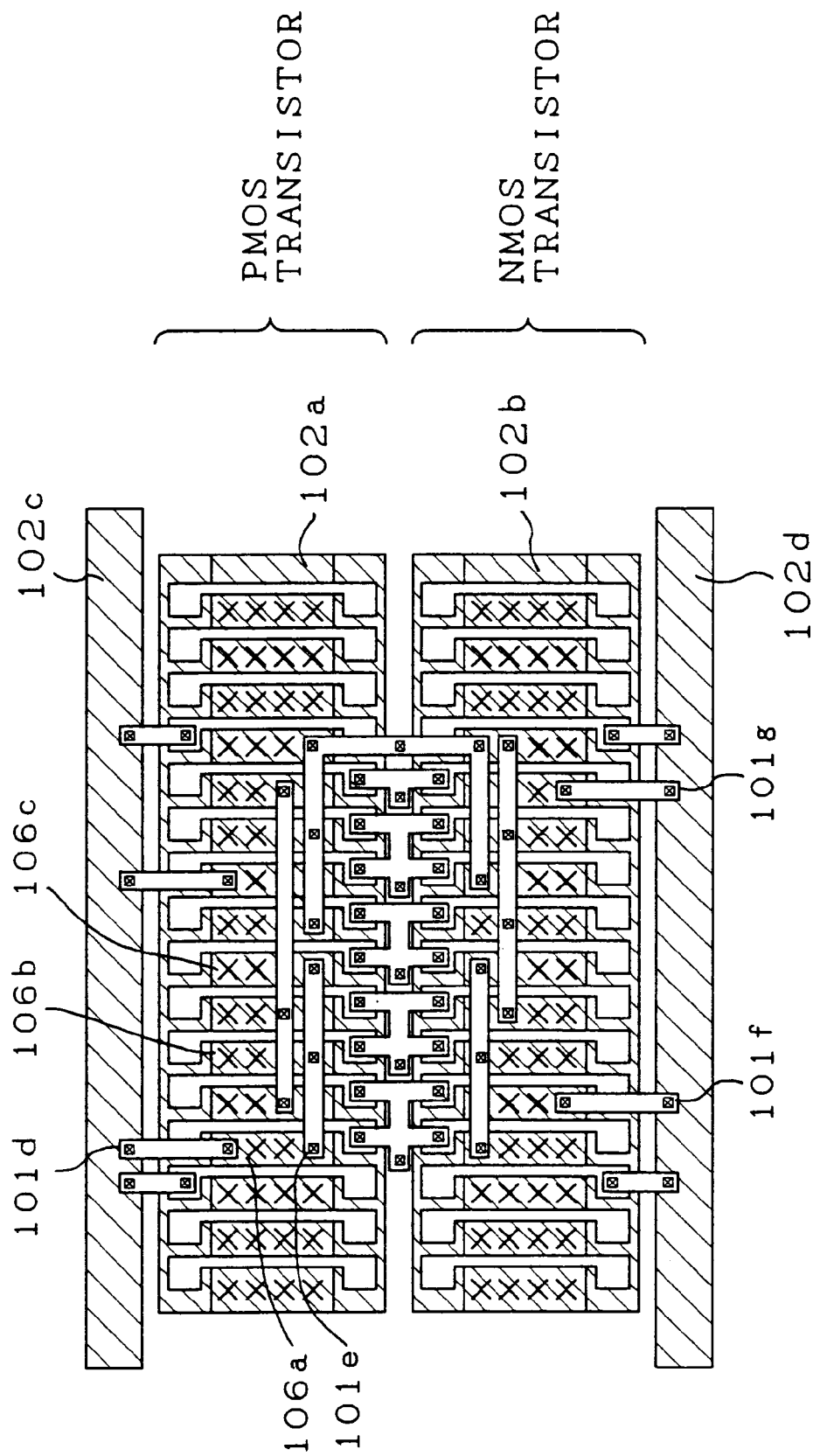
FIG. 15 is a layout diagram for explaining Embodiment 6 of the present invention.
Figure 16:
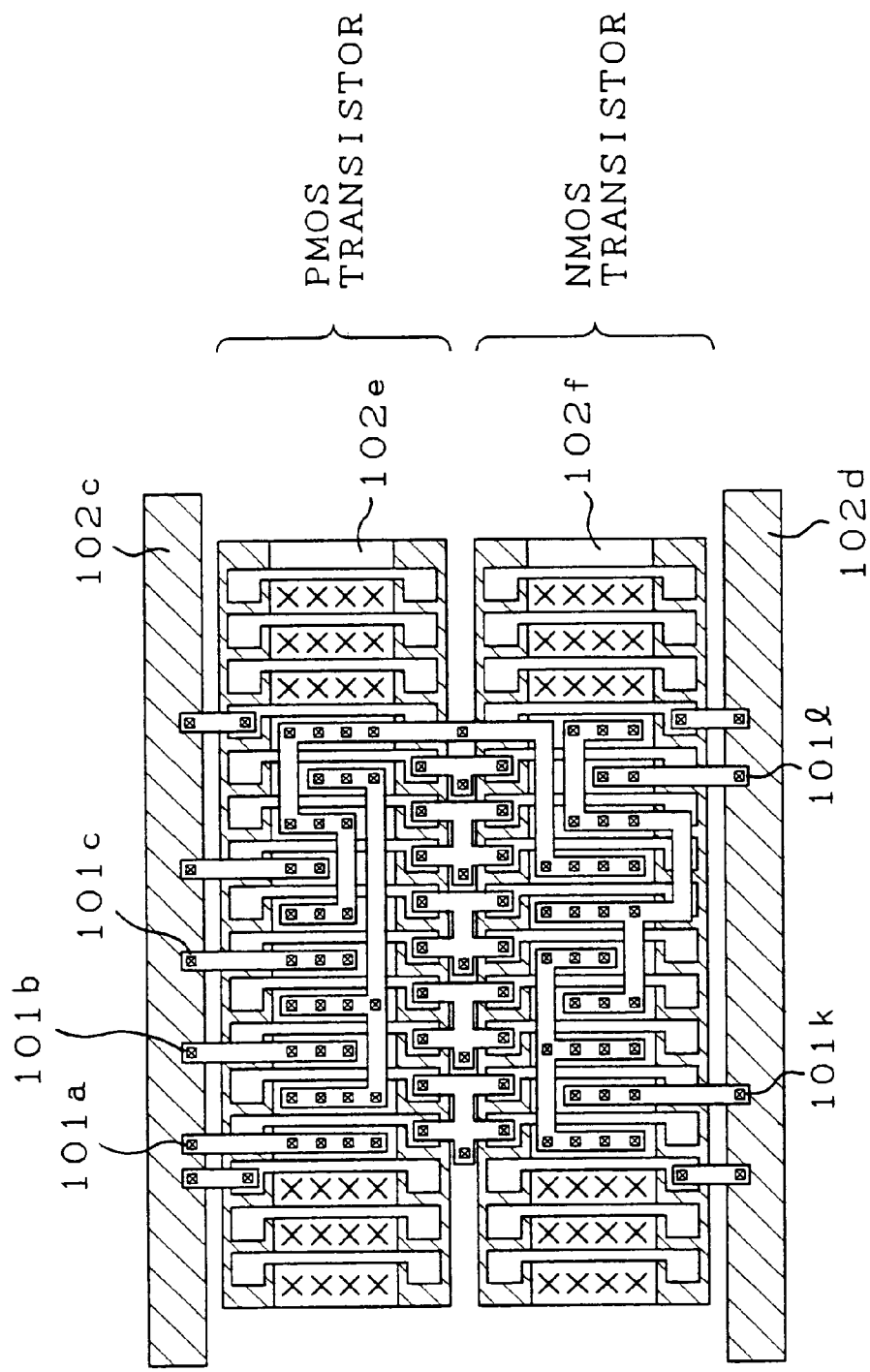
FIG. 16 is a layout diagram according to the prior art.
Figure 17:
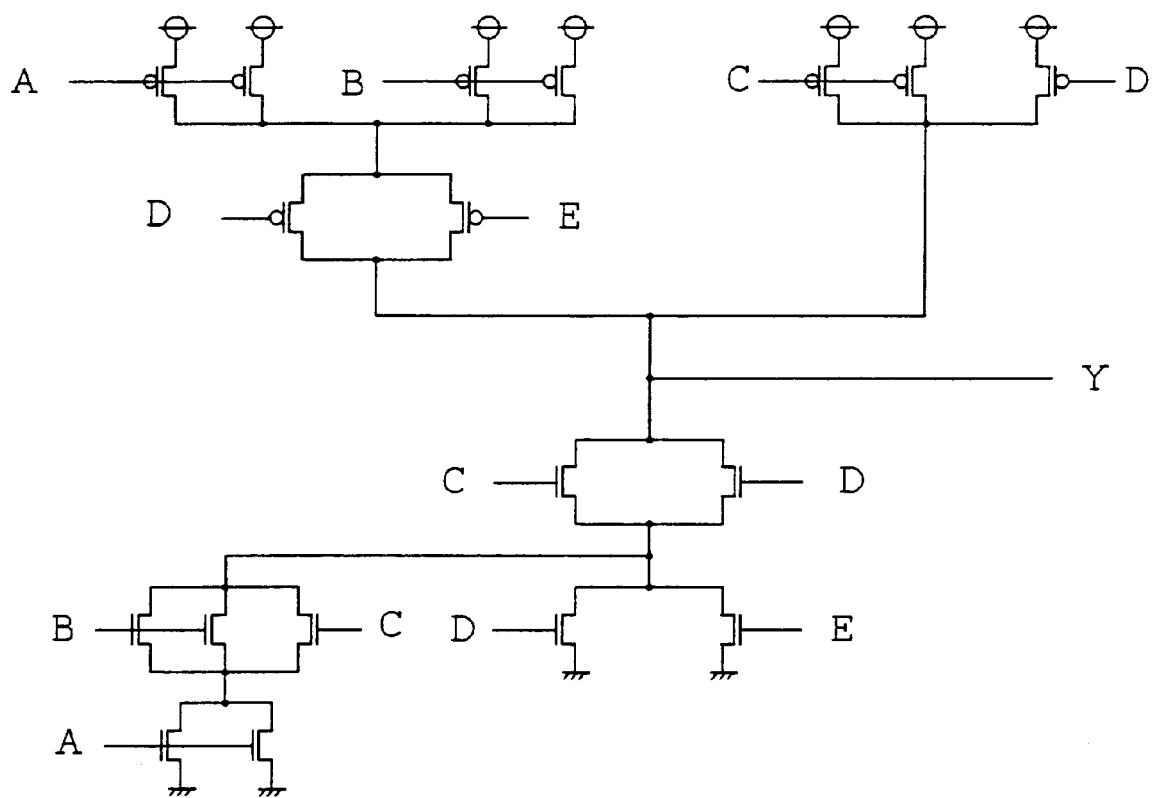
FIG. 17 is a circuit diagram of the layout shown in FIG. 16.

FIG. 15 is a layout diagram according to Embodiment 6, FIG. 16 is a layout diagram according to the prior art, and FIG. 17 is a circuit diagram thereof. In the drawings, numerals 102a and 102b denote salicided source regions, and numerals 102c and 102d denote salicided wiring layers of well regions, which are supplied with a power-supply potential VDD and a ground potential GND, respectively. Numerals 102e and 102f denote unsalicided source regions, numerals 101a to 101g denote first Al lines, and numerals 106a to 106c denote salicided source regions.

In the wiring structure according to a conventional layout shown in FIG. 16, the first Al lines 101a to 101c are used to supply electric power from the power-supply line 102c to the source region of PMOS transistor. Since the first Al lines 101a to 101c are close to one another, there is no empty area in the interior of the cell. On the other hand, in the wiring structure according to the layout of FIG. 15 which illustrates this Embodiment 6, the power-supply line 102c is connected, using contacts, to a source region 106a of PMOS transistor through the first Al line 101d. Therefore, the power-supply potential is fed to the source region 106a.

Since the source region 106a has been rendered low in resistance by salicidation, it can substitute as a metallic wiring. Thus, the first Al lines 101d and 101e are connected through the alloyed transistor source region 106a. The first Al line 101e is partially connected through contact holes in the source regions 106b and 106c of PMOS transistor, but since the source regions 106b and 106c have also been alloyed by salicidation, it follows that the power supply is connected to the whole surfaces of the source regions 106b and 106c. Thus, the power-supply potential can be fed to the source regions 106b and 106c. Likewise, also on the NMOS transistor side, although in FIG. 16 showing a conventional example connection to the source regions is made through plural contacts, like first Al lines 101k and 101l, it is at only one point that the contact to each source region is made in Embodiment 6 like the first Al lines 101f and 101g. Thus, an empty area resulting from salicidation and wiring of part of the source regions can be used for passing another line for example, and, in this way, a design margin is greatly improved.

Now, a description will be given of a preferred modification of Embodiment 6.

Figure 18:
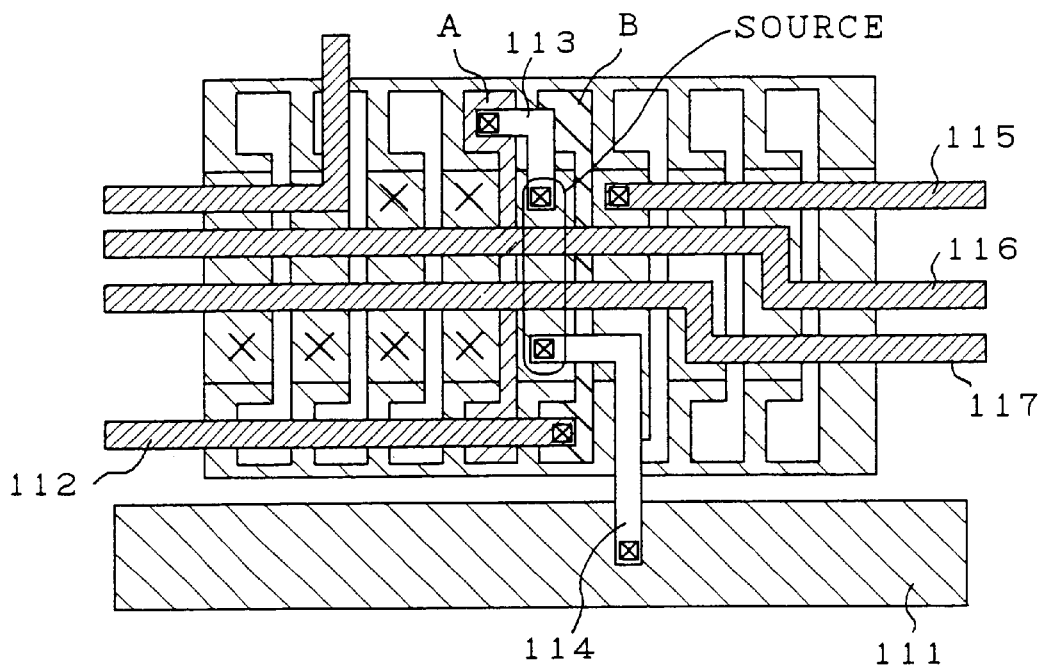
FIG. 18 is a layout diagram for explaining a preferred modification of Embodiment 6.
Figure 19:
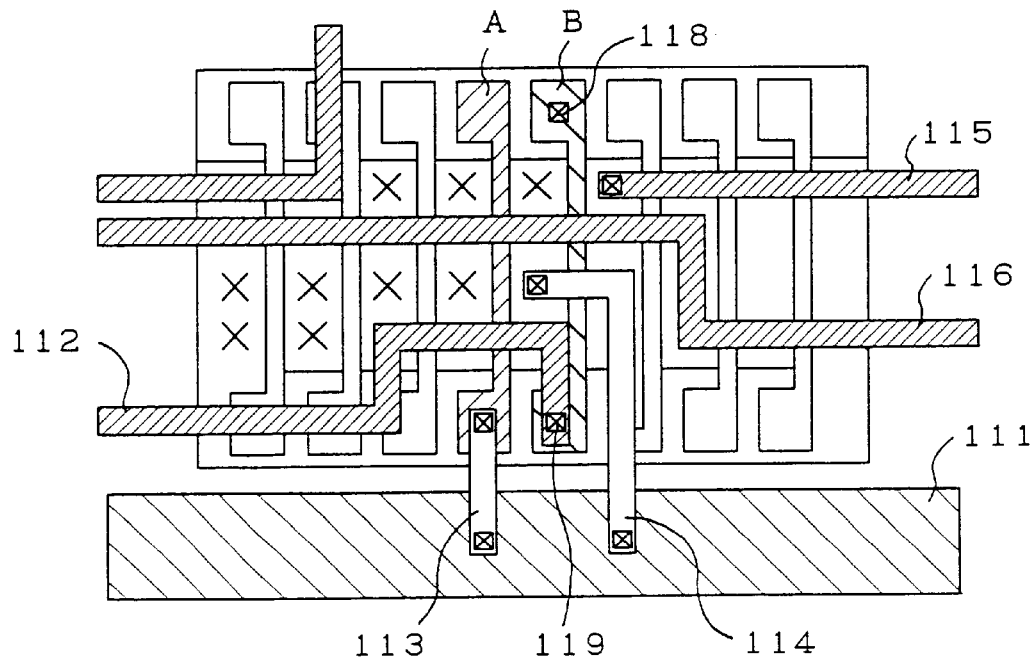
FIG. 19 is a layout diagram according to the prior art.
Figure 20:
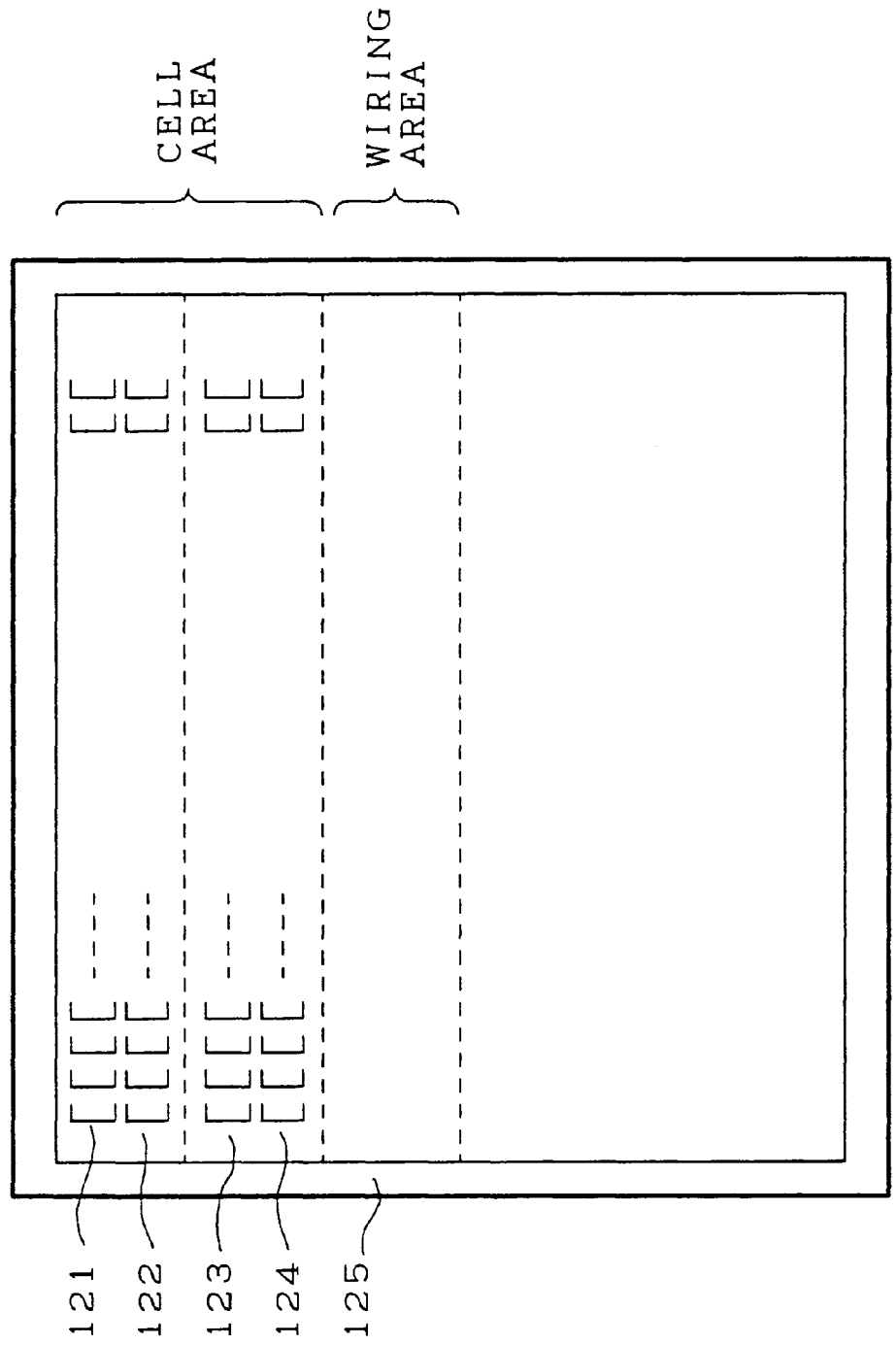
FIG. 20 is a configuration diagram showing a master chip image of a conventional embedded type gate array.
Figure 21:
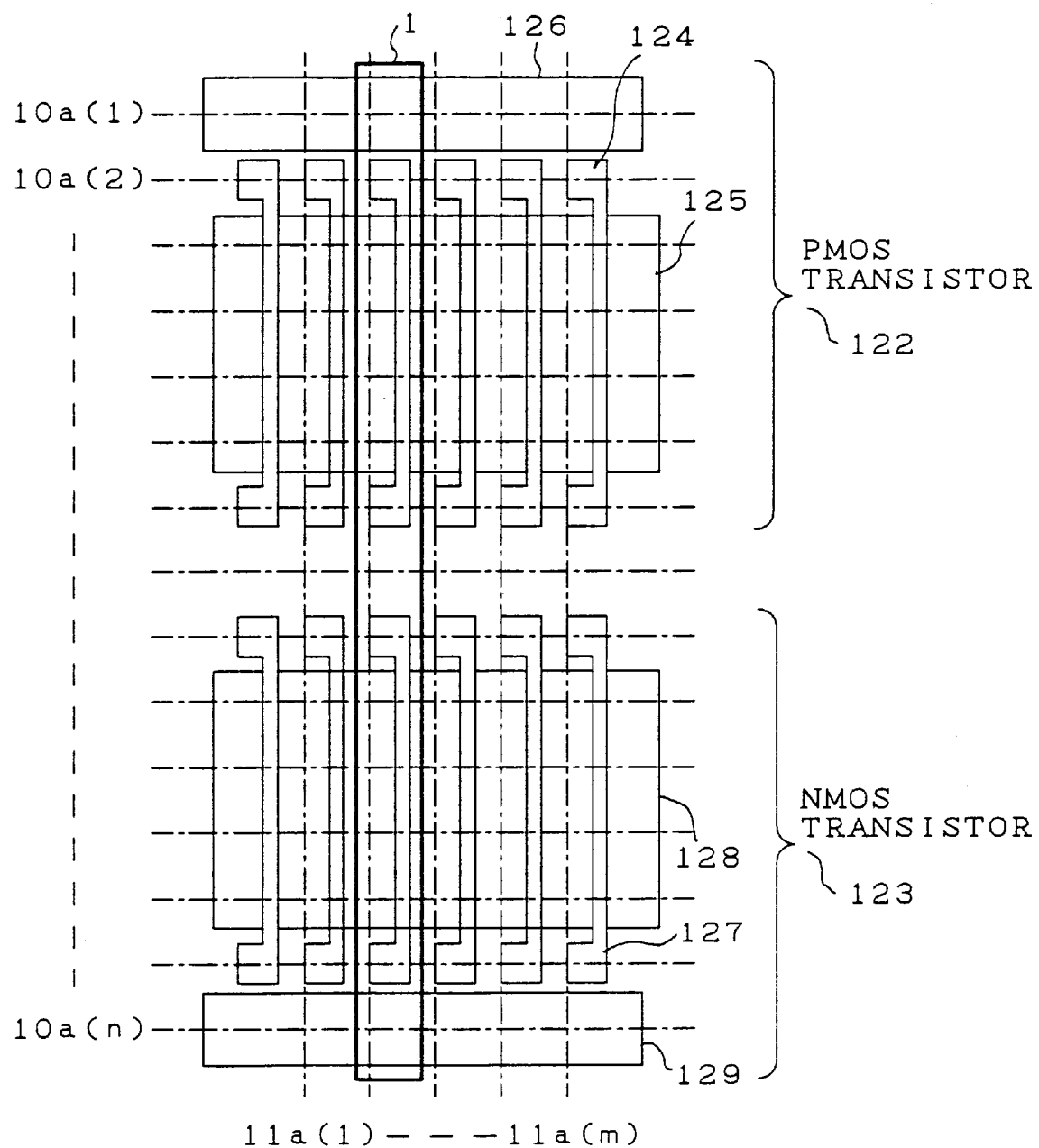
FIG. 21 is a diagram of a basic cell for forming a conventional logic circuit.
Figure 22:
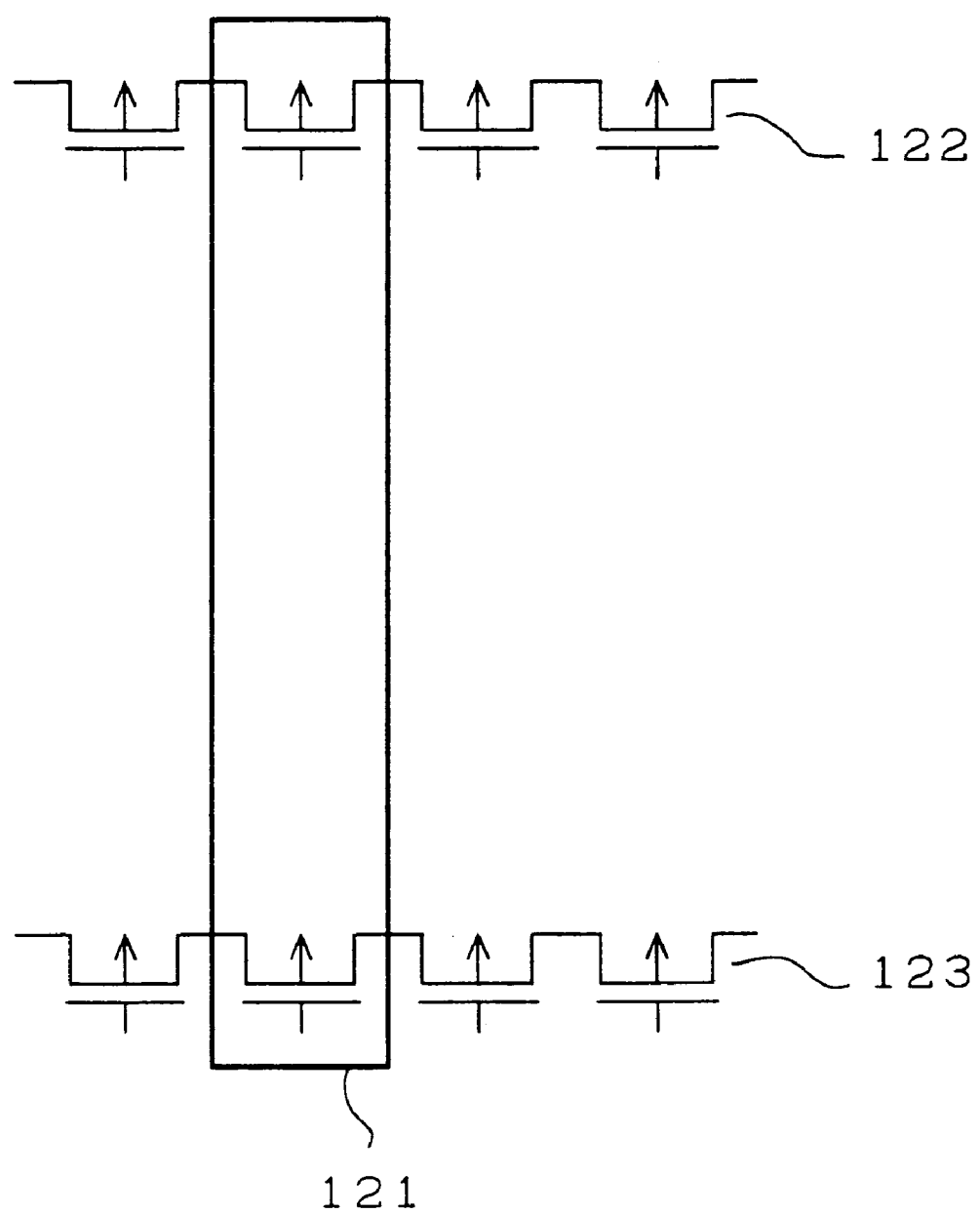
FIG. 22 is a circuit diagram of the basic cell shown in FIG. 21.

FIG. 18 is a layout diagram according to the preferred modification, and FIG. 19 is a layout diagram according to the prior art. In the drawings, numeral 111 denotes a ground line formed by saliciding the well region of an NMOS transistor, numerals 113 and 114 denote lines for the supply of ground potential, numerals 112 and 115 to 117 denote signal lines, numeral 118 denotes a connection point, and reference marks A and B denote NMOS transistors.

First, according to the conventional layout shown in FIG. 19, the gate potential of NMOS transistor A is dropped to the ground level by the line 113, thereby bringing the source and drain regions of NMOS transistor A into an electrically open condition. The line 114 is for grounding the source region of NMOS transistor, and the line 115 is a line connected to the drain region of NMOS transistor. Further, the line 112 is a line connected to the gate of NMOS transistor B, but due to the presence of line 116 of the same layer it is impossible to make a connection to the connection point 118 and a detour wiring to the same point is unavoidable. As a result, the wiring area in the cell is used up, so when it is desired to make wiring across the cell, it is impossible to use the wiring of the same layer for this purpose.

On the other hand, according to the layout of the preferred modification illustrated in FIG. 18, if the line 114 and the salicided and alloyed source region of NMOS transistor B adjacent thereto are connected using a contact hole, and if the line 113 and the salicided and alloyed source region of NMOS transistor B are connected using a contact hole, the lines 114 and 113 are electrically connected with to each other through the alloyed source region of NMOS transistor B. At the same time, the source region of the same transistor can be grounded. Since the line 113 is connected to the gate of NMOS transistor A, the gate can be grounded. Consequently, the portion of the line 113 in the conventional layout of FIG. 19 is no longer required and hence the line 112 in FIG. 18 can be laid out rectilinearly. As a result, it becomes possible to further draw the intracell crossing line 117 which has been impossible in a conventional layout such as in FIG. 19.

The power-supply line in the prior art is taken directly from the power supply 102c, as shown in FIG. 16, while according to Embodiment 6 and this preferred modification thereof, the above-described construction permits the power-supply line to be taken from the salicided transistor source region 106a in FIG. 15. Thus, as shown in FIG. 15, the area for passing the intercell connection wiring can be increased in the internal area of the cell. In this way it becomes possible for the area so far unemployable to be used for wiring and hence possible to reduce the chip size.

Even a look at only the interior of the cell shows that the power-supply lines 101b and 101c are no longer present and therefore, that area can be used for the intracell signal wiring. This is effective in enhancing the freedom of intracell wiring and reduction of the cell size. In a gate array, moreover, since the circuit is an aggregate of cells, a reduction in cell size is effective in that the chip size can be reduced.

According to the prior art, where power is fed to the source region to which the lines 101a to 101c are connected in FIG. 16, the lines 101a to 101c are used to this end, while according to Embodiment 6, power can be fed to the source region with use of only the two lines 101d and 101e shown in FIG. 15. Thus, the number of wiring lines can be decreased, so it is possible to reduce the cell size and hence the chip size.

What is claimed is:

1. A semiconductor integrated circuit device including:

a silicon substrate having a surface;

an electrically insulating layer on the surface;

first and second power supply wiring on said electrically insulating layer and substantially parallel to a first direction;

a first group of field effect transistors arranged parallel to the first direction on the surface and connected to said first power supply wiring for supplying a first potential;

a second group of field effect transistors arranged parallel to the first direction and connected to said second power supply wiring for supplying a second potential lower than the first potential, each of said field effect transistors having a source region and a drain region;

electrically conductive interconnection wiring on said electrically insulating layer and penetrating through said electrically insulating layer to the surface and interconnecting said first and second groups of field effect transistors, wherein said source and drain regions of each transistor in at least one of said first and second groups of field effect transistors includes a refractory metal silicide layer made low in resistance by heat treatment, said refractory metal silicide layer being connected to said electrically conductive interconnection wiring; and a signal line on said electrically insulating layer and not connected to said first and second groups of field effect transistors, at least part of said signal line being parallel to the first direction, disposed above and crossing one of said first and second groups of field effect transistors, and located between said first and second power supply wiring.

2. The semiconductor integrated circuit device according to claim 1, including a plurality of wiring grid dots in the source and drain regions of each of said field effect transistors, used as contacts, and arranged along a direction perpendicular to the first direction, said refractory metal silicide layer being connected to at least two of said wiring grid dots.

3. The semiconductor integrated circuit device according to claim 1, wherein said electrically conductive interconnection wiring comprises a first electrically conductive wiring connecting a first transistor selected from said first group of field effect transistors to a second transistor selected from said group of second field effect transistors, and a second electrically conductive wiring connected to said refractory metal silicide layer.

4. The semiconductor integrated circuit device according to claim 1, wherein said interconnection wiring is not electrically connected to said signal line at said first and second groups of field effect transistors.

\* \* \* \* \*